United States Patent [19]

Bleil

[11] Patent Number: 5,069,742
[45] Date of Patent: Dec. 3, 1991

[54] METHOD AND APPARATUS FOR CRYSTAL RIBBON GROWTH

[76] Inventor: Carl E. Bleil, 132 Chalmers Dr., Rochester, Mich. 48063

[21] Appl. No.: 475,398

[22] Filed: Feb. 5, 1990

[51] Int. Cl.[5] ............................................. C30B 13/30
[52] U.S. Cl. ........................... 156/620.7; 156/620.71; 156/620.73; 156/920.74; 156/DIG. 64; 156/DIG. 88; 156/DIG. 97
[58] Field of Search ........... 156/620.7, 620.71, 620.73, 156/620.74, DIG. 64, DIG. 88, DIG. 97

[56] References Cited

U.S. PATENT DOCUMENTS

| | | | |
|---|---|---|---|
| 3,121,619 | 2/1964 | Scholte | 156/620.73 |
| 3,630,684 | 12/1971 | Keller | 156/620.73 |
| 3,644,097 | 2/1972 | Knudsen | 156/620.73 |
| 3,681,033 | 8/1972 | Bleil | 156/620.7 |
| 3,759,671 | 9/1973 | Bleil | 156/620.7 |
| 4,563,976 | 1/1986 | Foell et al. | 422/249 |
| 4,563,979 | 1/1986 | Falchenberg et al. | 156/DIG. 97 |
| 4,578,143 | 3/1986 | Arai | 156/620.71 |
| 4,749,438 | 7/1988 | Bleil | 156/620.1 |
| 4,775,443 | 10/1988 | Bleil | 156/620 |
| 4,873,063 | 10/1989 | Bleil | 156/620.71 |

OTHER PUBLICATIONS

Thomas et al., "Rate Limits in Silicon Sheet Growth: The Connections Between Vertical and Horizontal Methods", Journal of CrystalGrowth 82 (1987) pp. 1 to 9.

Primary Examiner—Robert Kunemund
Attorney, Agent, or Firm—Warren D. Hill

[57] ABSTRACT

Crystals are grown in ribbon shapes by an apparatus for supporting a film of source material, capacitive electrodes contacting the film and heat pipes in thermal contact with the electrodes for first heating the material through the electrodes to near its melting temperature and then for controllably cooling the electrodes, an rf heater using the electrodes for melting the film in a zone, a heat pipe for causing solidification along one surface of the melt zone to form a ribbon, a pulling mechanism for moving the ribbon from the melt zone, a heater for melting bulk replenishing material to replenish the melt, and an auxiliary heating device for heating the ribbon after leaving the zone to prevent dendritic growth by maintaining low axial temperature gradients.

3 Claims, 1 Drawing Sheet

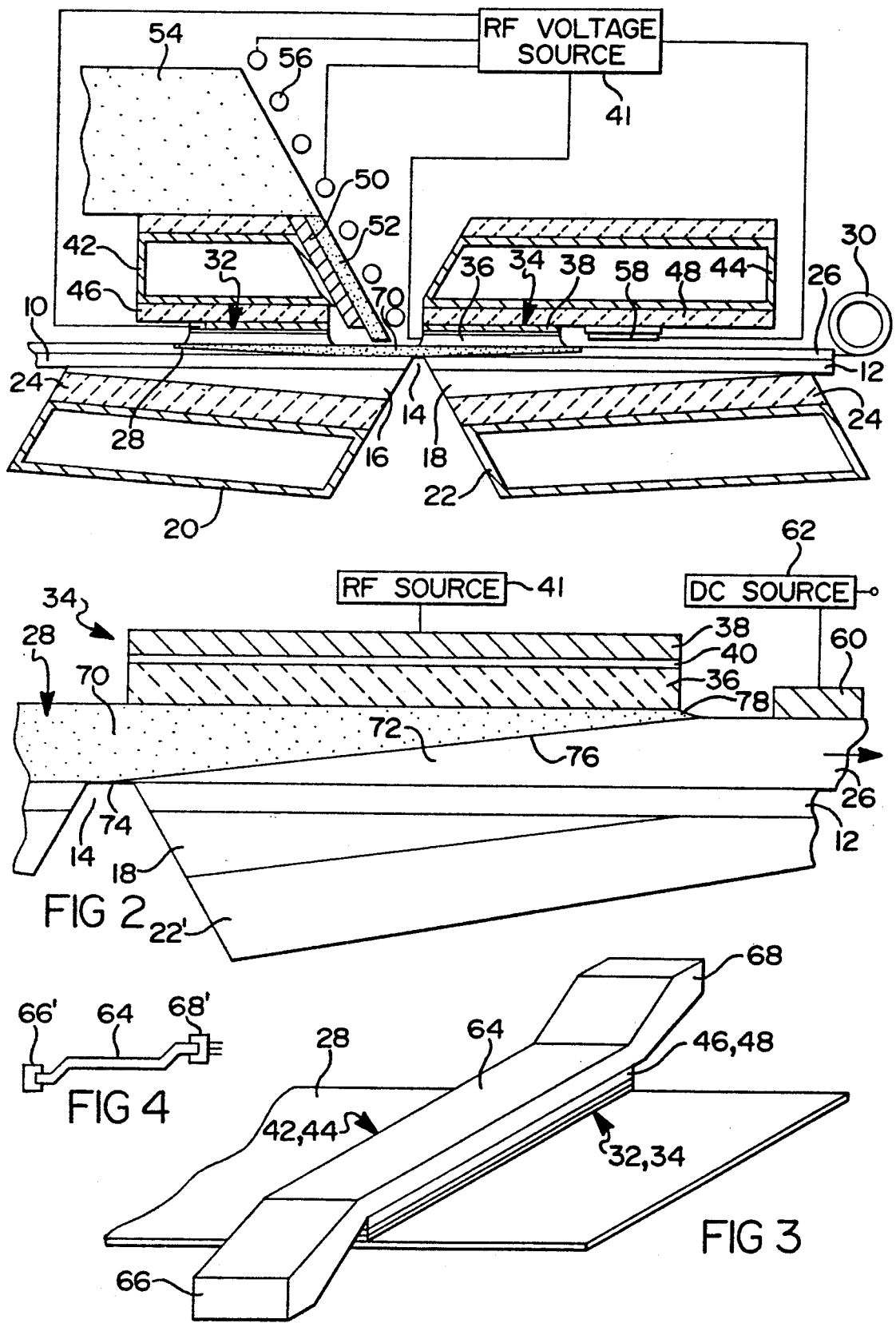

METHOD AND APPARATUS FOR CRYSTAL RIBBON GROWTH

FIELD OF THE INVENTION

This invention relates to the method and apparatus for the production of crystalline ribbons by zone melting and more particularly to such method and apparatus for growing crystalline ribbons free of dendritic growth.

BACKGROUND OF THE INVENTION

There is a need for thin crystalline ribbons and films of many materials such as silicon and other semiconductors. These ribbons are often very costly and difficult to produce. For example, thin wafers of monocrystalline semiconductor materials are generally produced from monocrystalline boules grown by the Czochralski technique. The preparation of the thin wafers from large crystal boules requires slicing and polishing, is a costly and time consuming technique, and inherently wastes much of the boule. Consequently, much effort has been directed toward growing thin monocrystalline ribbons that need only be scribed and broken to be used.

Ribbons of semiconductors have been produced by pulling substantially in a horizontal plane from a melt surface, as disclosed by Bleil in U.S. Pat. Nos. 3,681,033 and 3,759,671. According to those patents, crystal ribbons are grown from a melt in a crucible wherein a heater is submersed below the melt surface, a heat sink is positioned above the melt surface, and the ribbon is pulled horizontally from the surface of the melt. This technique produces ribbons much faster than the previous methods. However, pulling a ribbon too quickly or at too great an angle from horizontal introduces grain boundaries and imperfections which degrade the performance of circuitry placed on the semiconductor surface. Moreover, the necessary controls to implement the process and produce very thin crystal ribbons and films of good quality are difficult to manage and thus the commercial advantage is reduced.

In some applications, it is desirable to prepare monocrystalline ribbons or films of semiconductor or other materials on insulator substrates, such as semiconductor on insulator, or SOI, structures. This can be accomplished by growing the ribbon on the insulator or bonding the ribbon onto insulator material by using, for example, electro-bonding techniques. The desired monocrystalline structure can be given to the ribbon material through a variety of "seeding" techniques, including beginning and maintaining the seeding process at a location away from the insulator material, thereby inducing a monocrystalline form to be propagated through the ribbon cross section.

For ribbons or SOI structures, a variety of methods for supplying the zone-melting energy have been used, including lasers and graphite heaters with energy-focusing means. Methods for inducing electrical currents in the semiconductor and other materials, by exposing them to a high frequency electric field, have been used to recrystallize cylindrical boules in a particularly energy efficient manner. However, induction methods have only recently been applied to ribbons in a manner permitting control of the shape and size of the zone of recrystallization as disclosed by Bleil in U.S. Pat. Nos. 4,749,438, Method and Apparatus for Zone Recrystallization, 4,775,443 Method and Apparatus for Zone Regrowth of Crystal Ribbons from Bulk Material, and 4,873,063, Apparatus for Zone Regrowth of Crystal Ribbons. These patent disclosures are incorporated herein by reference. It is taught to use capacitive current induction where it is desired to avoid direct contact between the material and the electrodes and to cause zone recrystallization in a thin layer of the material in a manner allowing the shape and size of the zone to be controlled. On the other hand, Rayleigh-Taylor instabilities may be incurred by spacing the electrode from the material to be melted.

The recent Bleil patents further reveal that through proper placement of appropriately shaped electrodes near the surface of a thin layer of material which exhibits sufficient electrical conductivity near its melting point, heating by means of induced electrical currents can produce desirable recrystallization zone sizes and shapes. According to one embodiment, two sets of sheet electrodes are used. A first set of electrodes, near the surface of the ribbon and separated in the pulling direction, induces electrical currents within a specific portion of the layer that are sufficient to raise the material to very nearly its melting temperature. A second pair of electrodes induce enough additional currents to cause a narrow region within the specific portion of the material to melt along a selected stable zone perpendicular to the pulling direction. Proper control of the two currents induced, in coordination with means for replenishing the melt zone and a means such as heat pipes for removing the heat supplied by the induction currents, allows the recrystallization to take place in a desired fashion, at an acceptably high pulling rate.

While ribbon growth has been demonstrated for a given material using the techniques disclosed in these patents, it has become apparent that improvements in the control of the process would lead to more reliable operation, extension to other materials and a better product. For example, there is a tendency for dendritic structures to form in the ribbon. It has been suggested that a low axial temperature gradient in the ribbon is necessary to prevent dendritic growth (P. D. Thomas and R. A. Brown, J. Crystal Growth 82, 1-9 (1987)). As a further example, the first set of electrodes for raising the material to near its melting temperature is limited in its thermal control capability and it is desired to enhance that function by improved temperature control techniques including accurately controlled cooling as well as heating.

SUMMARY OF THE INVENTION

It is therefore an object of the invention to provide a method and apparatus for producing a crystalline ribbon from a body of material in a manner to prevent dendritic growth.

The invention is carried out by a method of growing a crystal ribbon from source material comprising the steps of: electrically heating a body of source material to form and maintain a molten film having surfaces substantially coplanar with the desired ribbon, cooling one surface of the film to effect ribbon growth, moving the ribbon parallel to the surface in a direction away from the molten film, and controlling the axial temperature gradient in the ribbon adjacent the molten film to a low value by electrically heating the ribbon adjacent the molten film, whereby formation of dendritic structure is prevented in the ribbon.

The invention is further carried out by apparatus for forming a crystalline ribbon from source material comprising: means for supporting a film of material in a plane, heating means including primary planar electrodes parallel to the said plane for producing electrical currents in the material causing a film of material to melt along a zone in the source body, means for controllably removing heat from the melted film of material in a direction substantially perpendicular to the plane to effect ribbon growth, means for pulling the ribbon from the said zone in a direction parallel to the plane, means for replenishing the melted film, and means for controlling the axial temperature gradient in the ribbon adjacent the molten film to a low value comprising means for electrically heating the ribbon adjacent the molten film, whereby formation of dendritic structure is prevented in the ribbon.

BRIEF DESCRIPTION OF THE DRAWINGS

The above and other advantages of the invention will become more apparent from the following description taken in conjunction with the accompanying drawings wherein like references refer to like parts and wherein:

FIG. 1 is a cross-sectional view of an apparatus for horizontal crystalline ribbon growth according to the invention, FIG. 2 is an enlarged view of a portion of the apparatus of FIG. 1 modified according to a second embodiment, FIG. 3 is an isometric view of a portion of the apparatus of FIG. 1 and particularly showing a heat pipe, and FIG. 4 is a schematic view of a heat pipe according to an alternate embodiment of the invention.

DESCRIPTION OF THE INVENTION

While the ensuing description is directed to a development for growing monocrystalline ribbons of silicon, it will be recognized that it applies, with suitable modification, to other materials such as germanium and bismuth. For such materials the molten state of the substance has substantially higher electrical conductivity than the solid state and the surface tension between the liquid and solid is adequate to sustain a short unsupported molten zone. In producing SOI structures, the high surface tension is not a required property because of the support of the insulator substrate. The technology also applies to growth of ribbons of superconductor oxides which may be grown from a molten source material comprising a mixture of the desired oxide and a flux such as a molten salt. In this case the molten mixture must have a substantially higher electrical conductivity than the solid product, although the molten oxide, per se, may not have such high electrical conductivity.

A cross section of the apparatus is shown in FIG. 1. Two silicon support sheets 10, 12 are separated by a gap 14 and have upper surfaces which lie in a horizontal plane. Silicon wedges 16 and 18 lie directly under the respective sheets 10, 12 with the thick end of the wedges adjacent the gap 14 and the thin edges pointing outwardly. These wedges 16, 18 are supported by heat pipes 20 and 22, respectively, which are electrically insulated from the wedges by layers 24 of an oxide, such as beryllium oxide, which provide thermal conduction between the silicon sheets and wedges and the heat pipes. The silicon ribbon 26 to be formed by the process and a film 28 of source material are supported on the support sheets 10, 12. A pulling mechanism 30 attached to the ribbon is controlled to move the ribbon away from the gap 14. The use of silicon for supports and other melt contacting elements when processing silicon permits a crucible-free operation which does not allow impurities to contaminate the processed material. Similarly, when processing other materials the use of like material for the supports or other elements is advantageous although silicon may be used for processing materials of lower melting points. Graphite is also useful for use in a contaminant-free environment.

Above the film 28 of source material a pair of spaced primary planar ensemble electrodes 32 and 34 are situated generally on either side of the gap 14. Each electrode is parallel to the sheets 10 and 12 and contacts the upper surface of the film. The drawing shows the electrodes 32, 34 touching a molten portion of the film 28 but it should be noted that the entire film 28 will be a solid single crystal ribbon when the process is initiated. As best shown in FIG. 2, the electrode 34 has a lower plate 36 of silicon, an upper plate 38 of metal such as molybdenum, and a dielectric layer 40 such as silicon oxide sandwiched between the plates for capacitively coupling the plates. The upper plate 38 is connected to a terminal of a radio frequency voltage source 41. The electrode 32 has the same structure and its upper electrode is connected to another terminal of voltage source 41. Thus the pair of electrodes 32, 34 couple rf energy into the film 28 for resistance heating of the film.

An upper heat pipe 42 is mounted above the electrode 32 and thermally coupled to and electrically isolated from the electrode 32 by a layer 46 of oxide, such as beryllium oxide, and likewise a heat pipe 44 is mounted above the electrode 34 and coupled thereto through a beryllium oxide layer 48. The edge of the heat pipe 42 nearest the interelectrode spacing is covered by a quartz slab 50 and a slab 52 of silicon replenishing material. A larger body 54 of bulk silicon replenishing material is supported above the heat pipe 42 and is contiguous with the upper edge of the slab 52. An rf induction heating coil 56 is mounted adjacent the replenishing body 54 and slab 52 and is coupled to the rf source 41 to heat the replenishing material and cause surface melting by the skin effect so that molten silicon flows down to the film 28. The rate of flow is controlled by the source 41 to be consistent with the rate of ribbon growth.

An auxiliary electrode 58, as shown in FIG. 1, is connected to the rf source 41 and is supported by the heat pipe 44 outboard of the electrode 34 above the solid ribbon 26 for inductively coupling rf energy into the ribbon. The auxiliary electrode current is insufficient to melt the ribbon and is controlled independently of the primary current to heat the ribbon sufficiently to control its axial thermal gradient. Another embodiment is expressed in FIG. 2 wherein the auxiliary electrode 60 is outboard of the electrode 34 and makes ohmic contact with the ribbon 26. The electrode 60 is supplied by a dc source 62. A terminal of the dc source 62 will be connected to a suitable element (not shown) in contact with the solid film 28 to the left of the melt zone.

An alternate embodiment, not shown in the drawings, comprises modifying the FIGS. 1 and 2 configuration by replacing the structure to the left of the gap 14 by a crucible which supplies the molten portion of the film 28. The gap 14 then would be between the lip of the crucible and the silicon sheet 12. Suitable heating and replenishment of the crucible contents and electrode coupling to the contents would be required. The structure to the right of the gap and its operation would be the same as described with respect to FIGS. 1 and 2.

FIG. 3 shows the heat pipe 42 or 44 spanning the film 28 and the associated beryllium oxide layer 46 or 48.

The main body 64 of the heat pipe is stainless steel and is rectangular, having dimensions on the order of ⅜ inch high, ¾ inch wide and a length exceeding the ribbon width, say, six inches for a four inch wide ribbon. A preheat heater 66 comprising an inductance heater or resistance heater at one end and below the level of the main body 64 provides a thermal input to heat the silicon film when so needed. A heat sink 68 at the other end and above the main body 64 provides cooling when necessary to assure that the silicon electrode plate 36 does not melt. The heat sink may be cooled by radiation or by a cooling fluid. Similar heat pipe structures are used for the heat sinks 20 and 22.

To maintain the heat pipe at a constant temperature, both ends are held at substantially the same temperature, preferably within a fraction of a degree. The body between the two ends is thus at the same temperature to afford an isothermal surface and can act as an auxiliary heat source or heat sink. When the surrounding beryllium oxide medium 24 or 46 is hotter than the heat pipe body 64, the body absorbs heat and transfers it to the sink 68 until the surrounding medium is cooled to the body 64 temperature. In this case, the heat pipe effectively has two heat sources, heater 66 and the body 64 and one heat sink 68. Similarly, when the surrounding medium 24 or 46 is cooler than the heat pipe, the body 64 serves as an auxiliary heat sink for the heat pipe to transfer heat to the surrounding medium.

The heat pipes are constructed and operated in accordance with known principles as set forth in the two part paper, Asselman and Green, Heat Pipes, Philips tech Rev. 33, 104-113. 1973 (No. 4) and Philips tech Rev. 33, 138-148, 1973 (No. 5) with the added feature of using the isothermal heat pipe body as an auxiliary heat source or heat sink. The active working fluid is preferably bismuth or lithium and may be combined with an inactive gas such as argon. The application of the heat pipes to the ribbon growing process takes advantage of the high speed convective ability of the heat pipes to maintain a uniform temperature along its length and to maintain a constant temperature for varying heat flux. The particular temperatures to be used depend on several parameters such as the type and amount of material between the ribbon or melt and the heat sink and the rate of crystal growth. Typical temperatures are given below for an example.

The operation is initiated by placing on the support sheets 10, 12 a film of seed material having the desired crystal orientation. All the heat pipes are heated to 1400° C. to bring the temperature of the seed material to 1400° and then the auxiliary electrodes 58 or 60 are energized by rf or dc current to further raise the ribbon temperature to 1405°. The melt zone 70 is established by then applying the rf energy to the electrodes 32 and 34 to bring a portion of the ribbon up to the melting point, 1410°, due to resistance heating by the current flow through the film. The upper heat pipes 42 and 44 automatically change to cooling mode to remove heat from the electrodes 32 and 34 to keep the electrodes from melting. The lower heat pipes 20 and 22 are cooled to stabilize the sloping interface between the melt and the solid. When stabilized, the upper heat pipes will be at 1400° and the lower heat pipes will be at 1400°. After stability has been attained, the crystal growth mode is entered by pulling the ribbon and further lowering the lower heat pipe 22 temperature sufficiently to absorb all the heat of fusion at the interface 76. At a pull rate of 500 cm²/min the lower heat pipe 22 temperature will be about 1200°.

Throughout the steady state operation, two conditions are essential. First, the interface of the silicon electrodes 36 and the melt 70 is an isothermal plane maintained at the melting point of the silicon source material and the heat flux is regulated to prevent melting of the electrode. Second, the heat flux from the interface 72 determining the rate of solidification is controlled in accordance with the volume rate of ribbon pulling.

Steady state operation occurs after the system stabilizes upon start-up. The melting of the replenishing slab 52 and body 54 is begun and is regulated to match the ribbon growth to replenish the melt. The pulling mechanism 30 advances the ribbon as soon as the molten replenishing material enters the melt zone. The ribbon growth occurs essentially vertically and the ribbon is pulled horizontally or axially. This allows fast pulling speed at a low crystal growth rate because growth is taking place over a large area and growth is substantially perpendicular to the pulling direction.

In another embodiment of the heat pipes, both ends of each pipe is held at a constant temperature which is not adjustable for different modes of the process. This is accomplished by surrounding each end of the heat pipe with a constant temperature bath 66' and 68', respectively, as shown in FIG. 4. Heating means is provided to heat the bath 66' and the heat pipe supplies heat to the bath 68'. Cooling means are provided at the bath 68' for removing heat from the pipe. Each bath comprises a vessel containing a partially molten material which has a melting point at the desired temperature. By maintaining two phases of the material in equilibrium a precise constant temperature control is maintained at the melting point. In operation, the upper pipes 42 and 44 are held at, say, 1400°, and the lower pipes are at, say, 1200°. The seed material is heated first by the heat pipes to the highest temperature they can provide and then the auxiliary electrodes 58 or 60 are energized by rf or dc current to further raise the ribbon temperature to 1405°. The melt zone 70 is established by then applying the rf energy to the electrodes 32 and 34 to bring a portion of the ribbon up to the melting point, 1410°, due to resistance heating by the current flow through the film. The upper heat pipes 42 and 44 automatically change to cooling mode to remove heat from the electrodes 32 and 34 to keep the electrodes from melting. The temperature of the lower heat pipes 20 and 22 and the amount of material and the thermal conductivity of material between the lower heat pipes and the film 28 or ribbon 26 have been originally selected or adjusted to establish the desired sloping interface between the melt and the solid. After stability has been attained, the crystal growth mode is entered by pulling the ribbon and adjusting the heat flux from the ribbon in accordance with the rate of ribbon growth. Since the temperature of the heat pipe 22 can not be changed, the thickness of the material is changed to adjust the heat flux. That is accomplished by horizontally shifting the silicon wedge 18 or a similar wedge, not shown, to change the thickness of silicon or other wedge material between the ribbon 26 and the heat pipe 22.

In both heat pipe embodiments, each heat pipe serves as a heat clamp, providing a constant temperature (either for each mode or for all modes) substantially unaffected by variations in heat flux and a uniform temperature over a large area. A uniform heat flux between the heat pipes and the plane to be controlled is maintained by a constant thickness of each type of intervening material so that isothermal planes can be established. For example, the ensemble electrode 32 and the beryllium oxide layer 46 between the heat pipe 42 and the top surface of the melt 70 affords a uniform temperature gradient so that the electrode/melt interface has a uniform temperature. In the same way, a uniform heat flux from the interface 76 to the heat pipe 22 assures stability of the interface 76 plane.

The capacitive characteristic of the electrodes and the silicon plates 36 assures uniform current density passing from the electrodes into the material being melted so that the whole width of the film is subject to the same heating. The semiconductive quality of the electrode plates 36 permits the plate to serve as a conductive capacitor plate yet the relatively high resistance discourages lateral current flow in the plates that might increase current to film regions offering a lower path of resistance. Current flow in the sheets 10, 12 is inhibited by the gap 14. This principle of capacitive coupling to electrodes in ohmic contact with the film is disclosed in U.S. Pat. No. 4,873,063 but is refined here. Because of the uniform heating current density and the uniform surrounding temperature controlled by the heat pipes, the thermal gradients are uniform across the melt zone and wide ribbons can be produced.

The nucleating tip 74 of the wedge 72 is maintained within the gap 14 to prevent any tendency of the melt to touch and freeze to the support sheet 12. At least a portion of the melt bridges the gap between the tip 74 and the support 10 and is held by surface tension. The gap width between the tip and the support 10 may be on the order of 1 mm. The heat removal from the wedge 72 is sufficient to cause freezing at the melt interface to thereby cause ribbon growth. The shape of the melt zone is determined in part by properties of capacitive coupling and by the difference in electrical conductivity between the solid and liquid states of the silicon: the liquid conductivity is 30 times greater than the solid conductivity. As a result, the current prefers to flow in the liquid and the interface 76 between the melt 70 and the ribbon wedge 72 can be sharply controlled. After the melt profile is established, only low power is required to maintain the melt zone. A very thin nucleating tip 74 can be produced and a nearly planar solid-liquid growth interface 76 is developed. The growth interface is inherently stable because the liquid electrical and thermal conductivities are much larger than the solid and small changes in melt thickness will alter the resistance to return the interface to its stable position.

The high electrical conductivity ratio for silicon results in a wedge 72 angle of only 2°. The silicon wedge 18 below the sheet 12 is provided with the same angle as the wedge 72. Then the surface of the heat sink 22 or 22' is parallel with the melt interface 76 to enhance uniform heat transfer from the interface. That is, the thickness of silicon across the ribbon wedge 72, the sheet 12 and the wedge 18 will be the same along the region of crystal growth. The same arrangement is used below the sheet 10. Thus the shape and position of the melt zone is determined and the electrodes 32 and 34 are positioned to contact only the molten surface. An exit meniscus 78 separates the outer edge of the electrode 34 and the upper ribbon surface. It is important that the melt does not solidify at the electrode 34 since it may then stick to the electrode.

The chief purpose of the auxiliary electrode is to adjust for low axial thermal gradient to avoid dendritic growth. Thus separate current adjustment is required for the auxiliary electrode 58 or 60. A secondary advantage to the auxiliary electrode is that the added heat helps control the position of the exit meniscus 78 and thus avoid the tendency of the ribbon to adhere to the electrode 34. The auxiliary electrode is also useful to heat the seed material for forming the melt in the initial heating process.

The embodiments of the invention in which an exclusive property or privilege is claimed are defined as follows:

1. A method of growing a crystal ribbon from source material comprising the steps of:
   electrically heating a body of source material by primary current to form and maintain a molten film having surfaces substantially coplanar with the desired ribbon,
   cooling one surface of the film to effect ribbon growth, wherein the combined heating and cooling steps control the temperature gradient in the film normal to the film surface,
   moving the ribbon parallel to the surface in an axial direction away from the molten film, and
   preventing dendritic structure formation by controlling the axial temperature gradient in the ribbon adjacent the molten film to a low value by electrically heating the ribbon adjacent the molten film by current insufficient to melt the ribbon and controlled independently of the primary current, whereby formation of dendritic structure is prevented in the ribbon.

2. The invention as defined in claim 1 wherein the step of electrically heating the ribbon comprises applying dc current to the ribbon for resistance heating of the ribbon.

3. The invention as defined in claim 1 wherein the step of electrically heating the ribbon comprises capacitively inducing radio frequency current in the ribbon for resistance heating of the ribbon.

* * * * *